(12) United States Patent
Ou

(10) Patent No.: US 6,753,800 B2
(45) Date of Patent: Jun. 22, 2004

(54) METHOD FOR SELECTING CAPACITORS

(75) Inventor: Wei-Yang Ou, Kaohsiung (KR)

(73) Assignee: Industrial Technology Research Institute, Hsinchu (TW)

( * ) Notice: Subject to any disclaimer, the term of this patent is extended or adjusted under 35 U.S.C. 154(b) by 10 days.

(21) Appl. No.: 10/330,139

(22) Filed: Dec. 30, 2002

(65) Prior Publication Data

US 2003/0218917 A1 Nov. 27, 2003

(30) Foreign Application Priority Data

May 22, 2002 (TW) ........................................ 91110750 A

(51) Int. Cl.⁷ ............................................... H03M 1/66
(52) U.S. Cl. ........................................ 341/144; 341/172
(58) Field of Search ................................ 341/144, 172, 341/120, 122, 133, 150

(56) References Cited

U.S. PATENT DOCUMENTS

| | | | | |
|---|---|---|---|---|
| 4,652,858 A | * | 3/1987 | Kokubo et al. | 341/144 |
| 4,853,698 A | * | 8/1989 | Roessler | 341/150 |
| 5,057,838 A | * | 10/1991 | Tsuji et al. | 341/133 |
| 5,376,936 A | * | 12/1994 | Kerth et al. | 341/150 |
| 5,684,487 A | * | 11/1997 | Timko | 341/172 |
| 5,973,633 A | * | 10/1999 | Hester | 341/172 |
| 6,154,162 A | * | 11/2000 | Watson et al. | 341/150 |
| 6,169,508 B1 | * | 1/2001 | Edwards | 341/150 |
| 6,271,784 B1 | * | 8/2001 | Lynn et al. | 341/150 |
| 6,448,911 B1 | * | 9/2002 | Somayajula | 341/120 |
| 6,570,516 B1 | * | 5/2003 | Barker | 341/122 |
| 6,600,435 B2 | * | 7/2003 | Karube | 341/144 |

* cited by examiner

Primary Examiner—Jean Bruner Jeanglaude
(74) Attorney, Agent, or Firm—Birch, Stewart, Kolasch & Birch, LLP

(57) ABSTRACT

A method for selecting capacitors in a charge redistribution digital-to-analog converter. m capacitors are arranged in the charge redistribution digital-to-analog converter. First, a signal is input to the charge redistribution digital-to-analog converter to identify n output units of the charge redistribution digital-to-analog converter. Then, the initial capacitor at the initial address and the following n−2 capacitors at the following n−2 addresses are continuously selected and if the following n−2 capacitors comprise the blank capacitor, the next capacitor is selected instead of the blank capacitor and a new blank capacitor is identified. Next, the initial address is changed to the address of the capacitor next to the last selected capacitor. Finally, the n−1 selected capacitors are output for the output units of the charge redistribution digital-to-analog converter. The n and m are positive integers and m>n>=1.

6 Claims, 5 Drawing Sheets

METHOD FOR SELECTING CAPACITORS

This nonprovisional application claims priority under 35 U.S.C. §119(a) on patent application Ser. No. 091110750 filed in TAIWAN on May 22, 2002, which is herein incorporated by reference.

BACKGROUND OF THE INVENTION

1. Field of the Invention

The invention relates to a method for selecting capacitors, and more particularly about an improved method for a charge redistribution digital-to-analog converter to select capacitors and reduce non-linear phenomenon produced by capacitor mismatch.

2. Description of the Related Art

The data weighted averaging method is typically used to reduce non-linear phenomenon produced by capacitor mismatch in a charge redistribution digital-to-analog converter. FIG. 1 is a schematic diagram illustrating the method for selecting capacitors by the typical data weighted averaging method. There are eight capacitors $U_0 \sim U_7$ in FIG. 1. Then, nine continuous signals are input to the charge redistribution digital-to-analog converter. The contexts of the signals are 2, 3, 4, 2, 4, 5, 7, 6, 8 in order. The context of the first input signal is 2. Two capacitors are selected from the capacitors $U_0 \sim U_7$. For the first input signal, the selected capacitors 102 include the capacitors $U_0$ and $U_1$. Then, the context of the second input signal is 3. Three capacitors are selected from the capacitors $U_0 \sim U_7$. Because the last capacitor of the selected capacitors 102 is the capacitor $U_1$, the capacitor $U_2$ and the following two capacitors are selected for the second input signal. The selected capacitors 104 include the capacitors $U_2$, $U_3$ and $U_4$. Next, the context of the third input signal is 4. Four capacitors are selected from the capacitors $U_0 \sim U_7$. Because the last capacitor of the selected capacitors 104 is the capacitor $U_4$, the capacitor $U_5$ and the following three capacitors are selected for the third signal. The selected capacitors 106 include the capacitors $U_5$, $U_6$, $U_7$ and $U_0$. According to the above method, for the fourth input signal, the selected capacitors 108 include the capacitors $U_1$ and $U_2$. For the fifth input signal, the selected capacitors 110 include the capacitors $U_3 \sim U_6$. For the sixth input signal, the selected capacitors 112 include the capacitors $U_7$ and $U_0 \sim U_3$. For the seventh input signal, the selected capacitors 114 include the capacitors $U_4 \sim U_7$ and $U_0 \sim U_3$. For the eighth input signal, the selected capacitors 116 include the capacitors $U_4 \sim U_7$ and $U_0$. For the ninth input signal, the selected capacitors 118 include the capacitors $U_1 \sim U_7$ and $U_0$.

According to the method shown in FIG. 1 to select capacitors, the non-linear phenomenon produced by capacitor mismatch can be reduced. As applied in the charge redistribution digital-to-analog converter, however, some constant input (such as input the signals whose content are 2, 2, 2, 2 or 4, 4 circle) may result in a mismatch error produced by periodic capacitors to reduce electrical characteristics. Thus, the typical data weighted averaging method is improved to reduce the mismatch error produced by periodic capacitors.

FIG. 2 is a schematic diagram illustrating the method for selecting capacitors by the improved data weighted averaging method. For the improved data weighted averaging method, one more capacitor is added to select. As shown in FIG. 2, there are nine capacitors $U_0 \sim U_8$. Then, nine continuous signals are input to the charge redistribution digital-to-analog converter. The contexts of the signals are 2, 3, 4, 2, 4, 5, 7, 6, 8 in order. The context of the first input signal is 2. Two capacitors are selected from the capacitors. For the first input signal, the selected capacitors 202 include the capacitors $U_0$ and $U_1$. Then, the context of the second input signal is 3. Three capacitors are selected from the capacitors $U_0 \sim U_7$. Because the last capacitor of the selected capacitors 202 is the capacitor $U_1$, the capacitor $U_2$ and the following two capacitors are selected for the second input signal. The selected capacitors 204 include the capacitors $U_2$, $U_3$, and $U_4$. Next, the context of the third input signal is 4. Four capacitors are selected from the capacitors $U_0 \sim U_7$. Because the last capacitor of the selected capacitors 204 is the capacitor $U_4$, the capacitor $U_5$ and the following three capacitors are selected for the third input signal. The selected capacitors 206 include the capacitors $U_5$, $U_6$, $U_7$ and $U_8$. According to the above method, for the fourth input signal, the selected capacitors 208 include the capacitors $U_0$ and $U_1$. For the fifth input signal, the selected capacitors 210 include the capacitors $U_2 \sim U_5$. For the sixth input signal, the selected capacitors 212 include the capacitors $U_6 \sim U_8$, $U_0$ and $U_1$. For the seventh input signal, the selected capacitors 214 include the capacitors $U_2 \sim U_8$. For the eighth input signal, the selected capacitors 216 include the capacitors $U_0 \sim U_5$. For the ninth input signal, the selected capacitors 218 include the capacitors $U_6 \sim U_8$ and $U_0 \sim U_4$.

According to the method shown in FIG. 2 to select capacitors, the mismatch error produced by periodic capacitors can be reduced. But applied in the charge redistribution digital-to-analog converter, some constant input (such as input the signals whose content are 1, 1, 1, 1 circle) may result in a non-linear phenomenon. Furthermore, when input and selected capacitors form a regular relationship, the mismatch error produced by periodic capacitors may occur.

SUMMARY OF THE INVENTION

The present invention is directed to a method for selecting capacitors in a charge redistribution digital-to-analog converter implemented to reduce the mismatch error produced by periodic capacitors and the non-linear phenomenon produced by capacitor mismatch.

Accordingly, the present invention provides a method for selecting capacitors in a charge redistribution digital-to-analog converter. In the charge redistribution digital-to-analog converter, m capacitors are arranged. The m capacitors comprise an initial capacitor, an address of which is an initial address, and a blank capacitor, an address of which is a blank address. First, a signal is input to the charge redistribution digital-to-analog converter to identify n output units of the charge redistribution digital-to-analog converter. Then, the initial capacitor at the initial address and the following n−2 capacitors at the following n−2 addresses are continuously selected and if the following n−2 capacitors comprise the blank capacitor, the next capacitor is selected instead of the blank capacitor and a new blank capacitor is identified. Next, the initial address is changed to the address of the capacitor next to the last selected capacitor. Finally, the n−1 selected capacitors are output for the output units of the charge redistribution digital-to-analog converter. The n and m are positive integers and m>n>=1.

Accordingly, the present invention also provides a method for selecting capacitors in a charge redistribution digital-to-analog converter. The charge redistribution digital-to-analog converter comprises m capacitors arranged in the charge redistribution digital-to-analog converter, an initial pointer directional to an initial capacitor of m capacitors, and a blank pointer directional to a blank capacitor of the m capacitors. First, a signal is input to the charge redistribution digital-to-analog converter to identify n output units of the charge redistribution digital-to-analog converter. Next, the initial capacitor directed by the initial pointer and the following n−2 capacitors are continuously selected and if the following n−2 capacitors comprise the blank capacitor directed by the blank pointer, the next capacitor is selected instead of the blank capacitor and the blank pointer is updated. Then, the initial pointer directional is changed to a new initial capacitor next to the last selected capacitor. Finally, the n−1 selected capacitors are output for the output units of the charge redistribution digital-to-analog converter. The n and m are positive integers and m>n>=1.

DESCRIPTION OF THE DRAWINGS

For a better understanding of the present invention, reference is made to a detailed description to be read in conjunction with the accompanying drawings, in which.

DETAILED DESCRIPTION OF THE INVENTION

Figure 1:
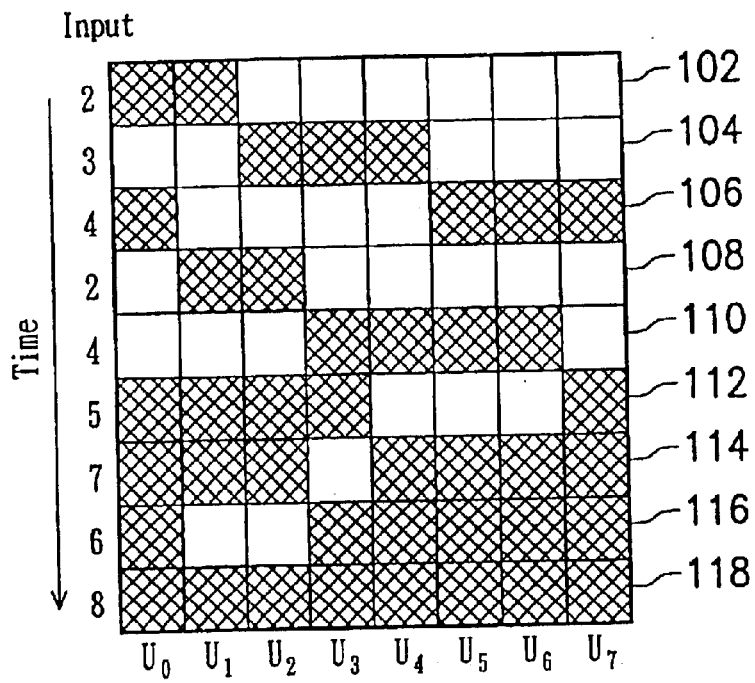
FIG. 1 is a schematic diagram illustrating the method for selecting capacitors by the typical data weighted averaging method.
Figure 2:
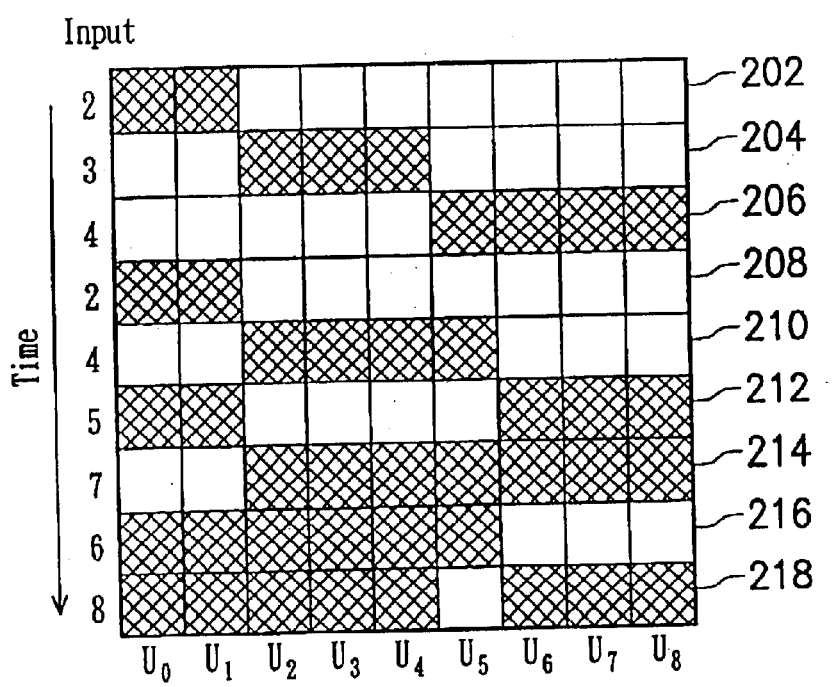
FIG. 2 is a schematic diagram illustrating the method for selecting capacitors by the improved data weighted averaging method.
Figure 3:
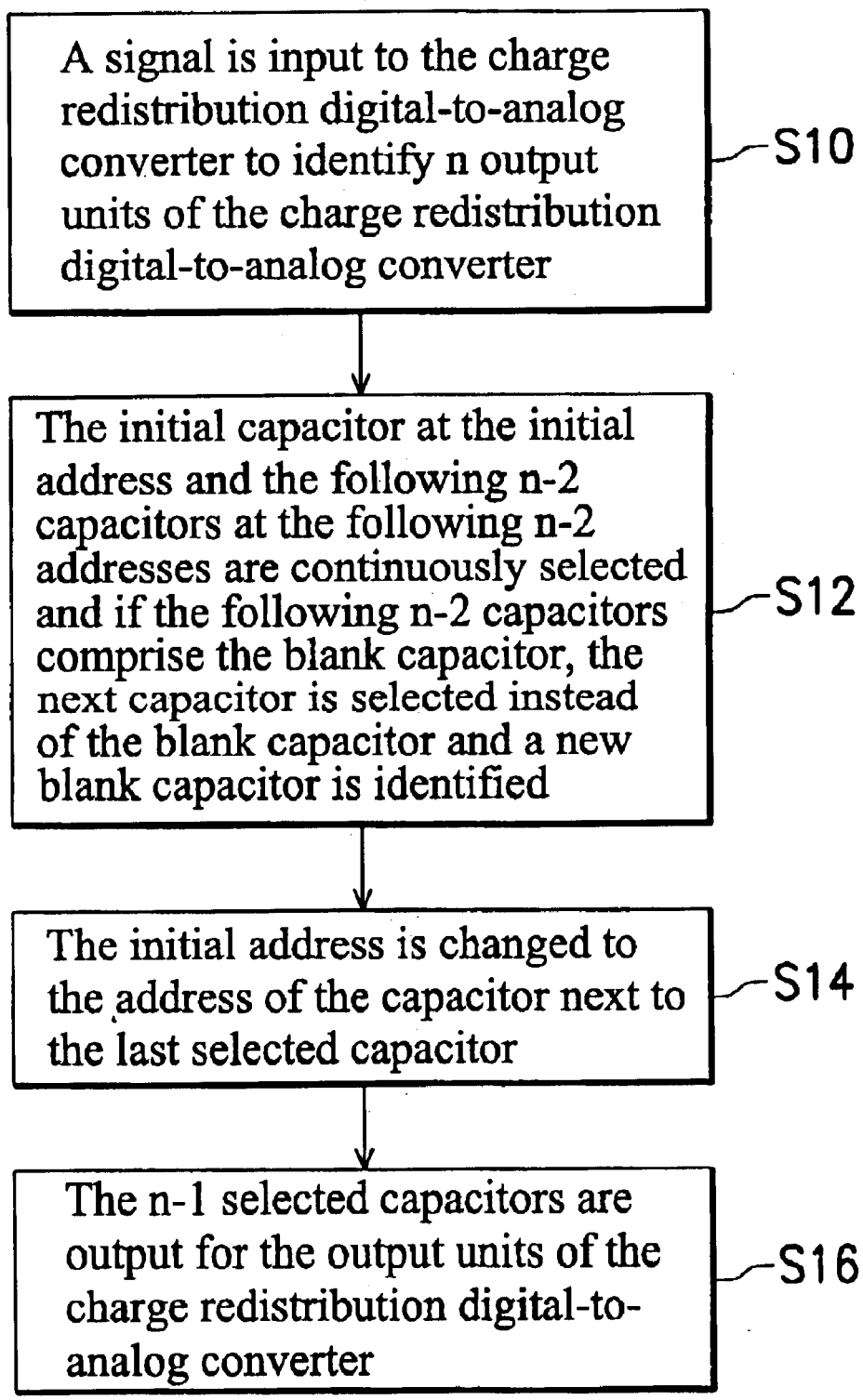
FIG. 3 is a flowchart illustrating the method for selecting capacitors in the charge redistribution digital-to-analog converter according to the first embodiment of the invention.

FIG. 3 is a flowchart illustrating the method for selecting capacitors in the charge redistribution digital-to-analog converter according to the first embodiment of the invention. In the charge redistribution digital-to-analog converter, m capacitors are arranged. The m capacitors comprise an initial capacitor, an address of which is an initial address, and a blank capacitor, an address of which is a blank address. First, a signal is input to the charge redistribution digital-to-analog converter to identify n output units of the charge redistribution digital-to-analog converter (S10). Then, the initial capacitor at the initial address and the following n−2 capacitors at the following n−2 addresses are continuously selected and if the following n−2 capacitors comprise the blank capacitor, the next capacitor is selected instead of the blank capacitor and a new blank capacitor is identified (S12). Next, the initial address is changed to the address of the capacitor next to the last selected capacitor (S14). Finally, the n−1 selected capacitors are output for the output units of the charge redistribution digital-to-analog converter (S16). The n and m are positive integers and m>n>=1.

Identification of a new blank capacitor (S12) comprises a capacitor randomly selected from the capacitors or selected next to the blank capacitor. Then, the selected capacitor is identified to the new blank capacitor, an address of which is a new blank address.

Figure 4A:
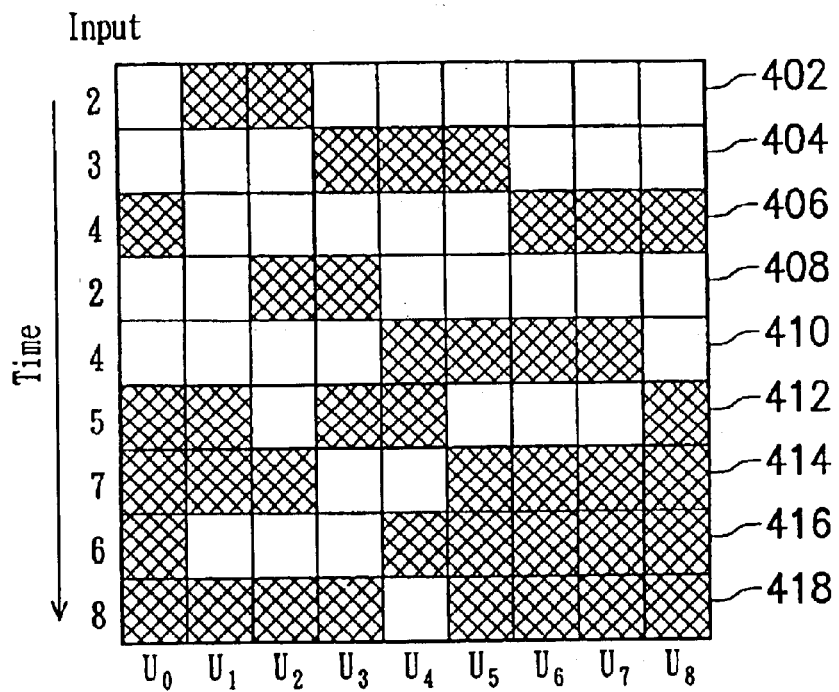
FIG. 4a is a schematic diagram illustrating an example of the method for selecting capacitors according to the first embodiment of the invention.
Figure 4B:
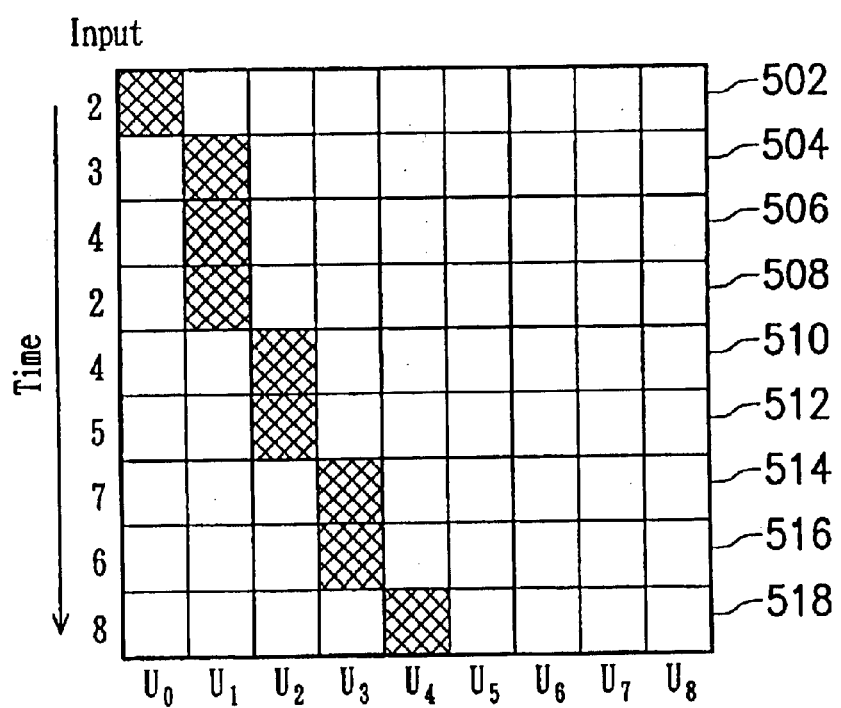
FIG. 4b is a schematic diagram illustrating an example of the method for selecting the blank capacitor according to the first embodiment of the invention.

FIG. 4a is a schematic diagram illustrating an example of the method for selecting capacitors according to the first embodiment of the invention. FIG. 4b is a schematic diagram illustrating an example of the method for selecting the blank capacitor according to the first embodiment of the invention. There are nine capacitors $U_0 \sim U_8$ in FIG. 4a and FIG. 4b. Then, nine continuous signals are input to the charge redistribution digital-to-analog converter. The contexts of the signals are 2, 3, 4, 2, 4, 5, 7, 6, 8 in order. At first, the initial capacitor directed by the initial address is the capacitor $U_0$. The blank capacitor 502 directed by the blank address is the capacitor $U_0$.

The context of the first input signal is 2. Two capacitors are selected from the capacitors $U_0 \sim U_8$. For the first input signal, the initial capacitor $U_0$ and the following one capacitor are originally selected into the selected capacitors 402. Because the selected capacitors 402 comprise the blank capacitor 502 ($U_0$), the next capacitor is selected instead of the blank capacitor 502 and a new blank capacitor 504 is identified to the capacitor next to the blank capacitor 502 ($U_0$). Thus, the selected capacitors 402 finally include the capacitors $U_1$ and $U_2$. The new blank capacitor 504 is the capacitor $U_1$. The address of the new blank capacitor 504 is a new blank address. Finally, the initial address is changed to the address of the capacitor next to the last selected capacitor. Therefore, the initial capacitor directed by the changed initial address is the capacitor $U_3$.

The context of the second input signal is 3. Three capacitors are selected from the capacitors $U_0 \sim U_8$. For the second input signal, the initial capacitor $U_3$ and the following two capacitors are selected into the selected capacitors 404. Because the selected capacitors 404 do not comprise the blank capacitor 504 ($U_1$), the selected capacitors 404 include the capacitors $U_3 \sim U_5$ and it is not necessary to change the address of the blank capacitor 504. Thus, the blank capacitor 506 directed by the unchanged blank address is the capacitor $U_1$. Finally, the initial address is changed to the address of the capacitor next to the last selected capacitor. Therefore, the initial capacitor directed by the changed initial address is the capacitor $U_6$.

According to the above method, for the third input signal, the blank capacitor 506 is the capacitor $U_1$ and the selected capacitors 406 include the capacitors $U_6 \sim U_8$ and $U_0$. For the fourth input signal, the blank capacitor 508 is the capacitor $U_1$ and the selected capacitors 408 include the capacitors $U_2$ and $U_3$. For the fifth input signal, the blank capacitor 510 is the capacitor $U_2$ and the selected capacitors 410 include the capacitors $U_4 \sim U_7$. For the sixth input signal, the blank capacitor 512 is the capacitor $U_2$ and the selected capacitors 412 include the capacitors $U_8$, $U_0$, $U_1$, $U_3$ and $U_4$. For the seventh input signal, the blank capacitor 514 is the capacitor $U_3$ and the selected capacitors 414 include the capacitors $U_5 \sim U_6$ and $U_0 \sim U_2$. For the eighth input signal, the blank capacitor 516 is the capacitor $U_3$ and the selected capacitors 416 include the capacitors $U_4 \sim U_8$ and $U_0$. For the ninth input signal, the blank capacitor 518 is the capacitor $U_4$ and the selected capacitors 418 include the capacitors $U_1 \sim U_3$, $U_5 \sim U_8$ and $U_0$.

Figure 5:
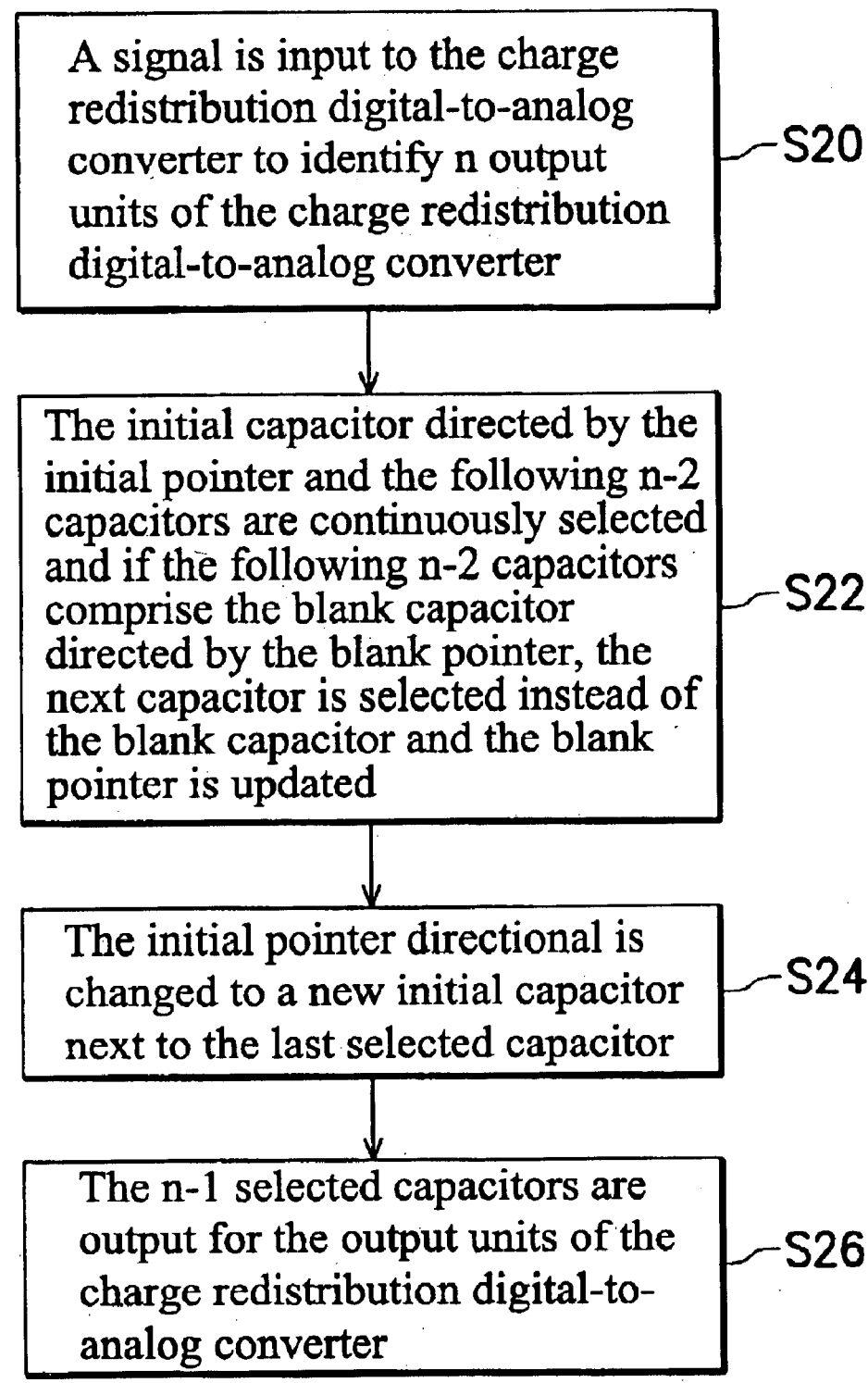
FIG. 5 is a flowchart illustrating the method for selecting capacitors in the charge redistribution digital-to-analog converter according to the second embodiment of the invention.

FIG. 5 is a flowchart illustrating the method for selecting capacitors in the charge redistribution digital-to-analog converter according to the second embodiment of the invention. The charge redistribution digital-to-analog converter comprises m capacitors arranged in the charge redistribution digital-to-analog converter, an initial pointer directional to an initial capacitor of m capacitors, and a blank pointer directional to a blank capacitor of the m capacitors. First, a signal is input to the charge redistribution digital-to-analog converter to identify n output units of the charge redistribution digital-to-analog converter (S20). Next, the initial capacitor directed by the initial pointer and the following n−2 capacitors are continuously selected and if the following n−2 capacitors comprise the blank capacitor directed by the blank pointer, the next capacitor is selected instead of the blank capacitor and the blank pointer is updated (S22). Then, the initial pointer directional is changed to a new initial capacitor next to the last selected capacitor (S24). Finally, the n−1 selected capacitors are output for the output units of the charge redistribution digital-to-analog converter (S26). The n and m are positive integers and m>n>=1.

Figure 6A:
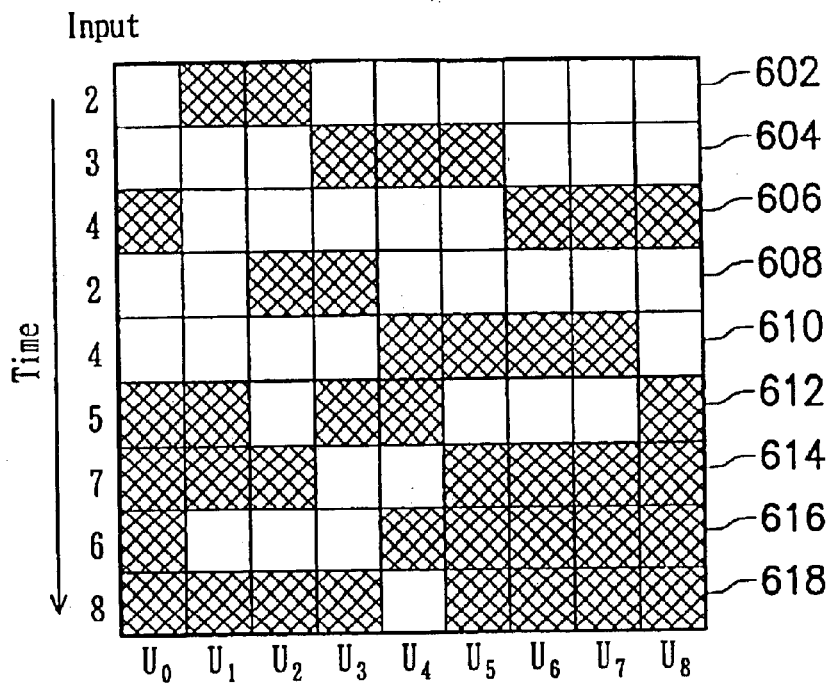
FIG. 6a is a schematic diagram illustrating an example of the method for selecting capacitors according to the second embodiment of the invention.
Figure 6B:
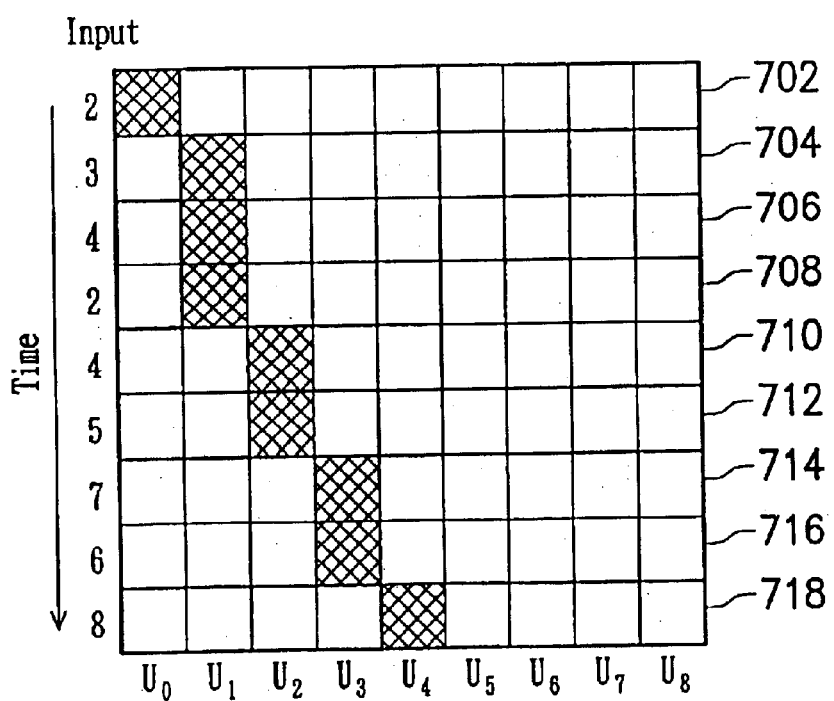
FIG. 6b is a schematic diagram illustrating an example of the method for updating the blank pointer according to the second embodiment of the invention.

FIG. 6a is a schematic diagram illustrating an example of the method for selecting capacitors according to the second embodiment of the invention. FIG. 6b is a schematic diagram illustrating an example of the method for updating the blank pointer according to the second embodiment of the invention. There are nine capacitors $U_0$~$U_8$ in FIG. 6a and FIG. 6b. Then, nine continuous signals are input to the charge redistribution digital-to-analog converter. The contexts of the signals are 2, 3, 4, 2, 4, 5, 7, 6, 8 in order. At first, the initial capacitor directed by the initial pointer is the capacitor $U_0$. The blank capacitor 702 directed by the blank pointer is the capacitor $U_0$.

The context of the first input signal is 2. Two capacitors are selected from the capacitors $U_0$~$U_8$. For the first input signal, the initial capacitor $U_0$ and the following one capacitor are originally selected for the selected capacitors 602. Because the selected capacitors 602 comprise the blank capacitor 702 ($U_0$), the next capacitor is selected instead of the blank capacitor 702 and the blank pointer is updated to direct to the capacitor next to the blank capacitor 702 ($U_0$). Then, the selected capacitors 602 finally include the capacitors $U_1$ and $U_2$. The new blank capacitor 704 directed by the updated pointer is the capacitor $U_1$. Finally, the initial pointer is updated to direct to the capacitor next to the last selected capacitor. Therefore, the initial capacitor directed by the updated initial pointer is the capacitor $U_3$.

The context of the second input signal is 3. Three capacitors are selected from the capacitors $U_0$~$U_8$. For the second input signal, the initial capacitor $U_3$ and the following two capacitors are selected for the selected capacitors 604. Then, because the selected capacitors 604 do not comprise the blank capacitor 704 ($U_1$), the selected capacitors 604 include the capacitors $U_3$~$U_5$ and it is not necessary to change the address of the blank capacitor 704. Thus, the blank capacitor 706 directed by the unchanged blank address is the capacitor $U_1$. Finally, the initial pointer is updated to direct to the capacitor next to the last selected capacitor. Therefore, the initial capacitor directed by the updated initial pointer is the capacitor $U_6$.

According to the above method, for the third input signal, the blank capacitor 706 is the capacitor $U_1$ and the selected capacitors 606 include the capacitors $U_6$~$U_8$ and $U_0$. For the fourth input signal, the blank capacitor 708 is the capacitor $U_1$ and the selected capacitors 608 include the capacitors $U_2$ and $U_3$. For the fifth input signal, the blank capacitor 710 is the capacitor $U_2$ and the selected capacitors 610 include the capacitors $U_4$~$U_7$. For the sixth input signal, the blank capacitor 712 is the capacitor $U_2$ the selected capacitors 612 include the capacitors $U_8$, $U_0$, $U_1$, $U_3$ and $U_4$. For the seventh input signal, the blank capacitor 714 is the capacitor $U_3$ and the selected capacitors 614 are the capacitors $U_5$~$U_8$ and $U_0$~$U_2$. For the eighth input signal, the blank capacitor 716 is the capacitor $U_3$ and the selected capacitors 616 include the capacitors $U_4$~$U_8$ and $U_0$. For the ninth input signal, the blank capacitor 718 is the capacitor $U_4$ and the selected capacitors 618 include the capacitors $U_1$~$U_3$, $U_5$~$U_8$ and $U_0$.

The method of the present invention provides different combinations of capacitors for different input signals to select capacitors in the charge redistribution digital-to-analog converter. Therefore, the present invention can reduce the mismatch error produced by periodic capacitors and the non-linear phenomenon produced by capacitor mismatch.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for selecting capacitors in a charge redistribution digital-to-analog converter, wherein m capacitors are arranged in the charge redistribution digital-to-analog converter, the m capacitors comprising an initial capacitor, an address of which is an initial address, and a blank capacitor, an address of which is a blank address, the method comprising:

inputting a signal to the charge redistribution digital-to-analog converter to identify n output units of the charge redistribution digital-to-analog converter;

continuously selecting the initial capacitor at the initial address and the following n−2 capacitors at the following n−2 addresses and if the following n−2 capacitors comprise the blank capacitor, selecting the next capacitor instead of the blank capacitor and identifying a new blank capacitor;

changing the initial address to the address of the capacitor next to the last selected capacitor; and outputting the n−1 selected capacitors for the output units of the charge redistribution digital-to-analog converter;

wherein n and m are positive integers and m>n>=1.

2. The method as claimed in claim 1, wherein identification of a new blank capacitor further comprises:

randomly selecting a capacitor from the capacitors; and identifying the selected capacitor to the new blank capacitor, an address of which is a new blank address.

3. The method as claimed in claim 1, wherein identification of a new blank capacitor further comprises:

selecting a capacitor next to the blank capacitor; and identifying the capacitor to the new blank capacitor, an address of which is a new blank address.

4. A method for selecting capacitors in a charge redistribution digital-to-analog converter, wherein the charge redistribution digital-to-analog converter comprises m capacitors arranged in the charge redistribution digital-to-analog converter, an initial pointer directional to an initial capacitor of m capacitors, and a blank pointer directional to a blank capacitor of the m capacitors, the method comprising:

inputting a signal to the charge redistribution digital-to-analog converter to identify n output units of the charge redistribution digital-to-analog converter;

continuously selecting the initial capacitor directed by the initial pointer and the following n−2 capacitors and if the following n−2 capacitors comprise the blank capacitor directed by the blank pointer, selecting the next capacitor instead of the blank capacitor and updating the blank pointer;

changing the initial pointer directional to a new initial capacitor next to the last selected capacitor; and outputting the n−1 selected capacitors for the output units of the charge redistribution digital-to-analog converter;

wherein n and m are positive integers and m>n>=1.

5. The method as claimed in claim 4, wherein updating the blank pointer further comprises:

randomly selecting a capacitor from the capacitors; and updating the blank pointer directional to the selected capacitor.

6. The method as claimed in claim 4, wherein updating the blank pointer further comprises:

selecting a capacitor next to the blank capacitor; and updating the blank pointer directional to the selected capacitor.

* * * * *